United States Patent
Chou et al.

(10) Patent No.: US 9,240,782 B2
(45) Date of Patent: Jan. 19, 2016

(54) ONE-DIMENSIONAL CAPACITIVE TOUCH PANEL WITH STABLE COUPLING CAPACITANCE

(71) Applicant: Touchplus Information Corp., New Taipei (TW)

(72) Inventors: Yung-Chan Chou, Yangmei (TW); Shih Hsien Hu, New Taipei (JP)

(73) Assignee: TOUCHPLUS INFORMATION CORP., New Taipei (TW)

( * ) Notice: Subject to any disclaimer, the term of this patent is extended or adjusted under 35 U.S.C. 154(b) by 146 days.

(21) Appl. No.: 13/854,148

(22) Filed: Apr. 1, 2013

(65) Prior Publication Data

US 2014/0083834 A1 Mar. 27, 2014

(30) Foreign Application Priority Data

Sep. 21, 2012 (TW) .............................. 101134828 A

(51) Int. Cl.
*H03K 17/975* (2006.01)
*H03K 17/96* (2006.01)
*G06F 3/044* (2006.01)

(52) U.S. Cl.
CPC ............ *H03K 17/9622* (2013.01); *G06F 3/044* (2013.01); *H01H 2239/006* (2013.01); *H03K 2217/960705* (2013.01)

(58) Field of Classification Search
CPC ............ G06F 3/044; H03K 2017/9606; H01H 2239/006
USPC .................................... 345/173, 174; 200/600
See application file for complete search history.

(56) References Cited

U.S. PATENT DOCUMENTS

| | | | | |
|---|---|---|---|---|
| 5,565,658 | A * | 10/1996 | Gerpheide et al. | 178/18.02 |
| 7,307,626 | B2 * | 12/2007 | Martchovsky | 345/174 |
| 7,821,502 | B2 * | 10/2010 | Hristov | 345/173 |
| 8,228,312 | B2 * | 7/2012 | Matsubara | 345/174 |
| 8,269,744 | B2 * | 9/2012 | Agari et al. | 345/174 |
| 8,514,185 | B2 * | 8/2013 | Hotelling | 345/173 |
| 8,599,150 | B2 * | 12/2013 | Philipp | 345/173 |
| 8,854,326 | B2 * | 10/2014 | Lin et al. | 345/173 |
| 2011/0290541 | A1 * | 12/2011 | Yeh | 174/257 |

* cited by examiner

*Primary Examiner* — R S Luebke
*Assistant Examiner* — Doblade Elliott
(74) *Attorney, Agent, or Firm* — WPAT, PC; Justin King

(57) ABSTRACT

A touch sensitive device includes a capacitive touch panel with plural electrodes, a driving and sensing circuit electrically connected to the electrodes through sensing lines, and at least one conductive member. The conductive member is arranged orthogonal to and crosses the sensing lines without contact and is electrically connected to the driving and sensing circuit. Therefore, a stable coupling capacitance is provided for a one dimensional capacitive touch panel for improved touch sense performance.

15 Claims, 18 Drawing Sheets

ONE-DIMENSIONAL CAPACITIVE TOUCH PANEL WITH STABLE COUPLING CAPACITANCE

CROSS-REFERENCE TO RELATED APPLICATION

This application claims the benefit of TAIWAN patent application no. 101134828, filed Sep. 21, 2012, which are herein incorporated by reference.

TECHNICAL FIELD

The invention is relevant to a touch sensitive device, especially to a capacitive touch panel-based device.

DESCRIPTION OF THE RELATED ART

It is well-known that every mobile phone or computing device has an instruction inputting panel arranged thereon. The electronic application provides a user interface for human-machine interactions. One of the related technologies is called as touch-sensitive displays (also known as "touch screen" or "touch panel"), it is becoming more and more popular for being intuitive and user-friendly. Touch-sensitive displays are widely used in electronic applications. Through signal analysis, the signal processor determines the location of the user contact on the touch-sensitive display and performs one or more corresponding operations in accordance with the location of the user contact. When user touches on the operational panel, the touched icon generates a control signal output to a motherboard of the electronic device, thereby executing an action corresponding to the signal. Touch-sensitive devices may detect touch via several different mechanisms, including but not limited to optical, resistive, and capacitive mechanisms. It is useful to determine the orientation of a finger for displaying text or images on the device, to allow a user to control an image on a touch-sensitive display by user finger over the image. Various methods may be used for determining an orientation of a finger on a touch-sensitive device.

Referring to FIG. 1, a conventional two dimensional capacitive touch sensitive device with differential type analog-to-digital converter (ADC) (single-ended type ADC is also applicable); in which a touch panel 80 is constituted mainly by plating or imprinting, on a film or a substrate such as glass or PMMA, plural horizontal electrodes (hereinafter called X electrodes) X1 to X9 and plural vertical electrodes (hereinafter called Y electrodes) Y1 to Y9, with two kinds of electrodes being arranged in crossing relation.

The electrodes above are, through conductive lines 81, electrically connected to a driving and sensing circuit 82 which is electrically connected to a microcontroller unit (MCU) 83. The microcontroller unit 83 serves to control the driving and sensing circuit 82 to send frequent signals to Y electrodes sequentially and the driving and sensing circuit 82 obtains, through X electrodes (for example, X1 and X2 in the figure), coupling capacitances C+ and C− produced by X electrodes and Y electrodes and then processes the coupled analog signals with an ADC 821. A result produced by processing is further converted into digital signal.

The digital signal above is sent to the microcontroller unit 83 to be further processed according to a specific algorithm in order to output XY coordinate data. Once the coordinate data is read by the touch sensitive device successfully, purpose of positioning the touching by a finger is fulfilled.

Referring to FIG. 2, an equivalent circuit diagram and signal comparison for the panel in FIG. 1 without a finger touching (single-ended type ADC is also applicable), and to FIG. 3, an equivalent circuit diagram and signal comparison for the panel in FIG. 1 with a finger touching (single-ended type ADC is also applicable); since processing technology for two dimensional touch panel is quite stable nowadays, difference between two coupling capacitances C+ and C− is small and consequently sensing signals V+ and V− obtained by the driving and sensing circuit also have slight difference (assuming V−>V+) as shown in FIG. 2 such that the comparator produces a result "0". FIG. 3 shows when a finger touches on a first column X1 of the electrodes on left side of the panel so that an equivalent capacitance of the finger is added to negative terminal of the comparator as a capacitance to earth C_finger, signal V− changes to be significantly lower than V+ and a result "1" is thus produced by the comparator.

However, the differential driving technique above is not so applicable to one dimensional capacitive touch panel featuring its lower cost and simpler process. Since one dimensional capacitive touch panel lacks Y electrodes, it needs to utilize adjacent X electrodes to yield coupling capacitances 91 and 92. Such kind of coupling capacitance is not only susceptible to layout and clearance of the electrodes and lacks stability, but also takes great opportunity of being affected by interference from surroundings and power source, resulting in an unstable result outputted.

SUMMARY

One objective of the present invention is to resolve the problem on unstable result due to unstable coupling capacitance in conventional one dimensional capacitive touch panel utilizing differential driving technique.

Another objective of the present invention is to provide an improved structure for touch sensitive device which allows for adjustment of signal resolution in order to obtain more accurate result.

To achieve the objectives above and others, a touch sensitive device of the invention comprises a capacitive touch panel, a driving and sensing circuit, and at least one conductive member, wherein the capacitive touch panel comprises plural electrodes electrically connected with the driving and sensing circuit through sensing lines.

The conductive member is arranged to cross the sensing lines in orthogonal way without contacting therewith and electrically connected to, through a driving line for instance, the driving and sensing circuit.

The touch sensitive device of the present invention has merit of good signal stability, resulting from coupling capacitance between the conductive member and the sensing lines not existing within the touch panel but existing on a carrier which carries the sensing lines instead, such as flexible flat cable (FFC), flexible printed circuit (FPC), or printed circuit board (PCB).

The present invention also has merits in that the device structure is quite simple rather than complicated, and that it does not need to do much effort in changing a legend structure into new one.

In the case of plural conductive members, the members can be of varying width depending on requirement for signal variation.

The conductive member may be made of materials such as carbon, silver paste, copper or aluminum foil. In one embodiment, the conductive member may include a mesh configuration.

The at least one conductive member may be arranged above sensing lines and on a covering layer of a carrier which encloses the sensing lines. Alternatively, the at least one conductive member may be arranged under the sensing lines and directly under an FFC in absence of a covering layer. Alternatively, the at least one conductive member may be arranged on a covering layer of a PCB and above plural sensing lines. Alternatively, the at least one conductive member may be arranged on one side of a PCB while the sensing lines on an opposite side.

The plural electrodes may be configured to be hexagonal and arranged to be a honeycomb pattern altogether.

The at least one conductive member may refer to a single conductive member arranged to cross the sensing lines. Alternatively, the at least one conductive member may refer to plural conductive members arranged to cross same group of the sensing lines. Alternatively, the at least one conductive member includes a first conductive member arranged to cross a first group of the sensing lines and a second conductive member arranged to cross a second group of the sensing lines where the first group and the second group have no common sensing lines. Alternatively, the at least one conductive member may include a first conductive member arranged to cross a first group of the sensing lines and a second conductive member arranged to cross a second group of the sensing lines where the first group and the second group have at least one common sensing line.

BRIEF DESCRIPTION OF THE DRAWINGS

The primitive objectives and advantages of the present invention will become apparent upon reading the following description and upon reference to the accompanying drawings in which.

DETAILED DESCRIPTION

In order to fully understand the manner in which the above-recited details and other advantages and objects according to the invention are obtained, a more detailed description of the invention will be rendered by reference to the best-contemplated mode and specific embodiments thereof. The following description of the invention is made for the purpose of illustrating the general principles of the invention and should not be taken in a limiting sense; it is intended to illustrate various embodiments of the invention. As such, the specific modifications discussed are not to be construed as limitations on the scope of the invention. It will be apparent to one skilled in the art that various equivalents, changes, and modifications may be made without departing from the scope of the invention, and it is understood that such equivalent embodiments are to be included herein. The terminology used in the description presented below is intended to be interpreted in its broadest reasonable manner, even though it is being used in conjunction with a detailed description of certain specific embodiments of the invention. Certain terms may even be emphasized below; however, any terminology intended to be interpreted in any restricted manner will be overtly and specifically defined as such in this detailed description section. Where the context permits, singular or plural terms may also include the plural or singular term, respectively. Moreover, unless the word "or" is expressly limited to mean only a single item exclusive from the other items in a list of two or more items, then the use of "or" in such a list is to be interpreted as including (a) any single item in the list, (b) all of the items in the list, or (c) any combination of items in the list. Preferred embodiments and aspects of the invention will be described to explain the scope, structures and procedures of the invention. In addition to the preferred embodiments of the specification, the present invention can be widely applied in other embodiments.

The invention proposes an improved structure for touch sensitive device featuring one dimensional capacitive touch sensitive devices which can be provided with a stable coupling capacitance and do not need much change on structure. Moreover, applied in either one dimensional or two dimensional device version, the present invention also suggests adjusting quantity, width, and voltage of the conductive member to raise signal resolution.

Figure 1:
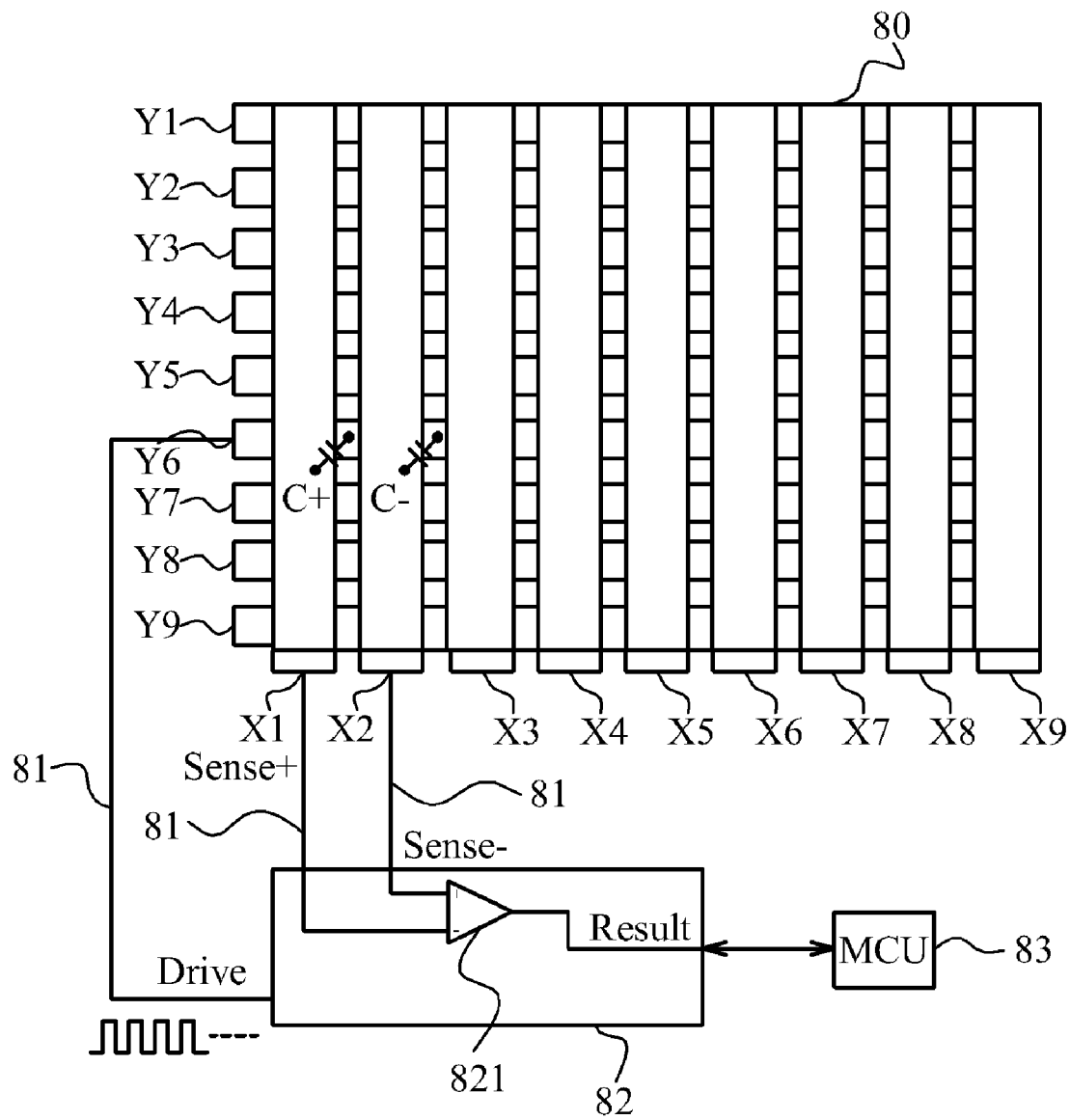
FIG. 1 shows a conventional two dimensional capacitive touch panel.
Figure 2:
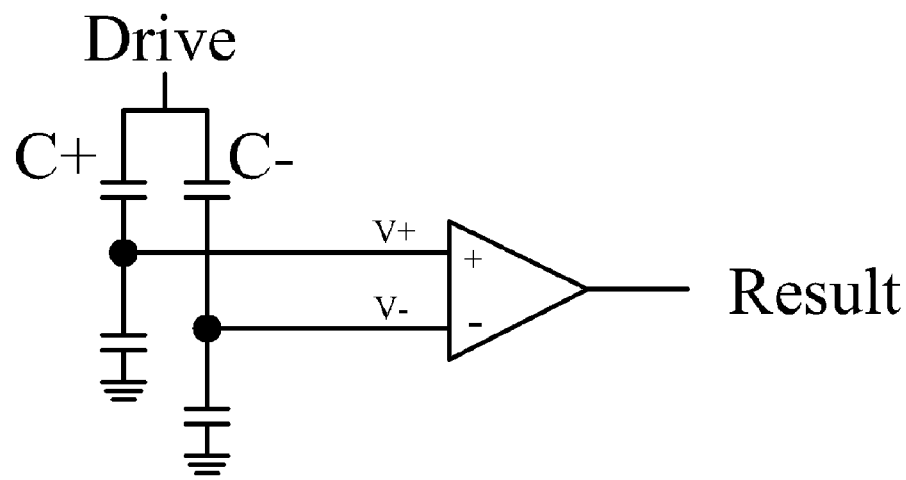
FIG. 2 shows an equivalent circuit diagram and signal comparison for the panel in FIG. 1 without a finger touching.
Figure 2:
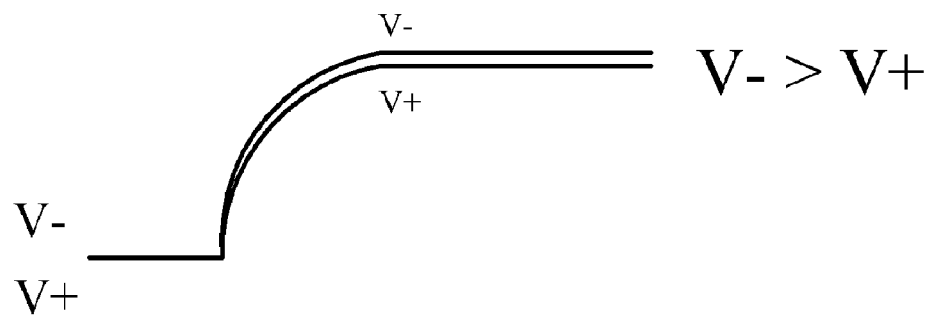
Figure 3:
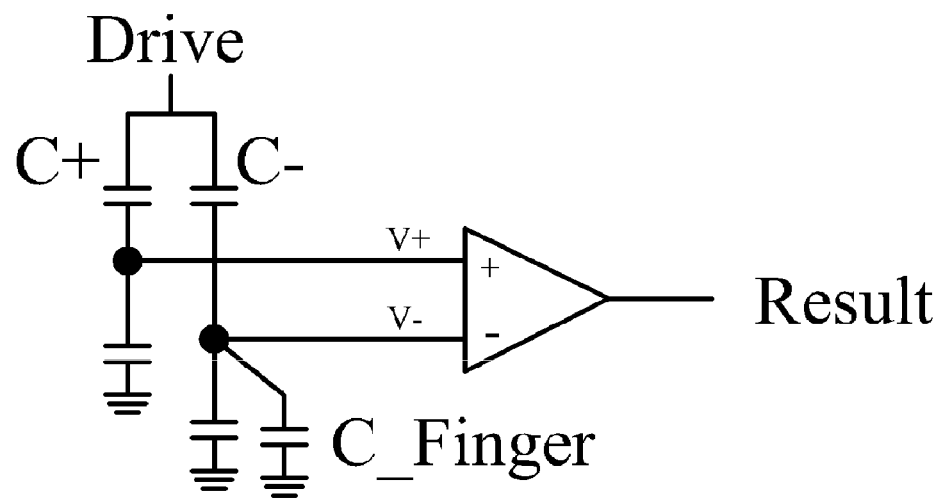
FIG. 3 shows an equivalent circuit diagram and signal comparison for the panel in FIG. 1 with a finger touching.
Figure 3:
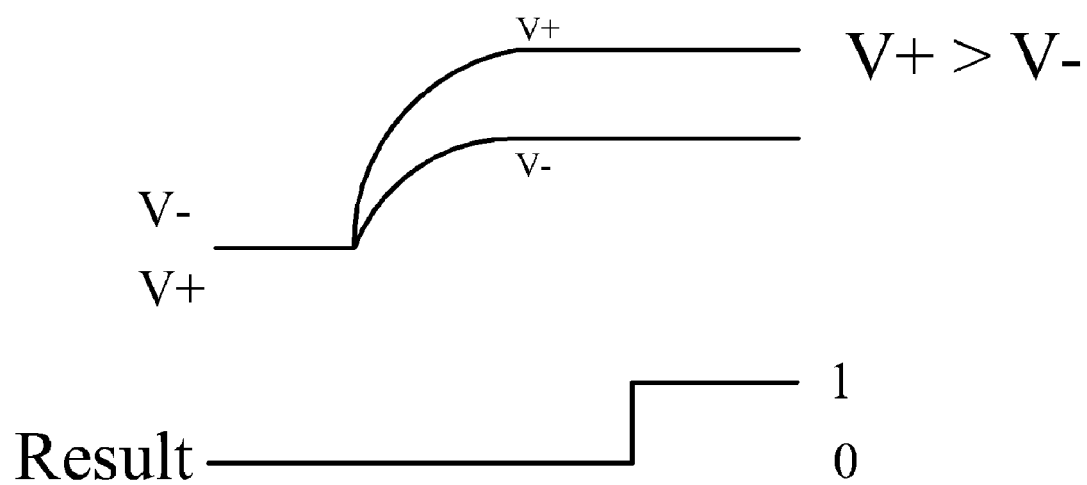
Figure 4:
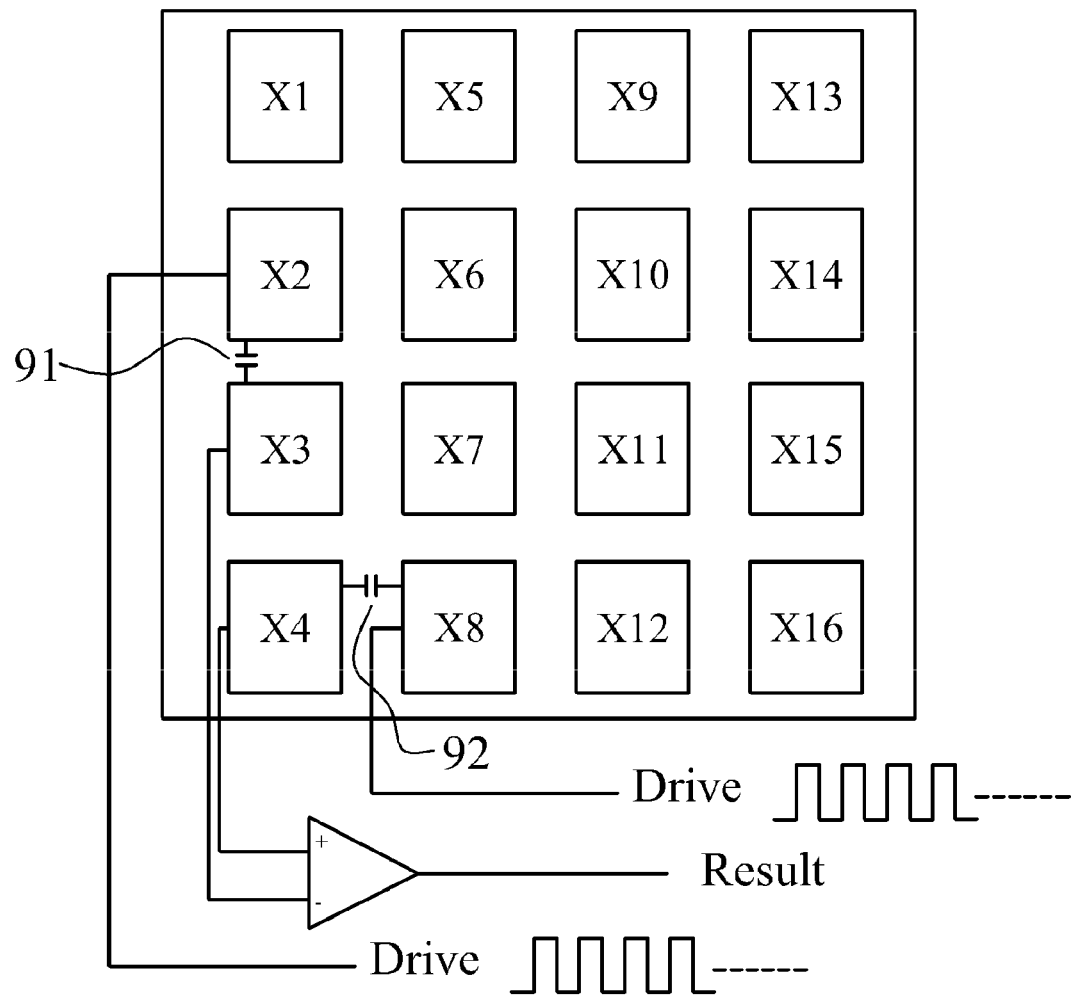
FIG. 4 shows a conventional one dimensional capacitive touch panel.
Figure 5:
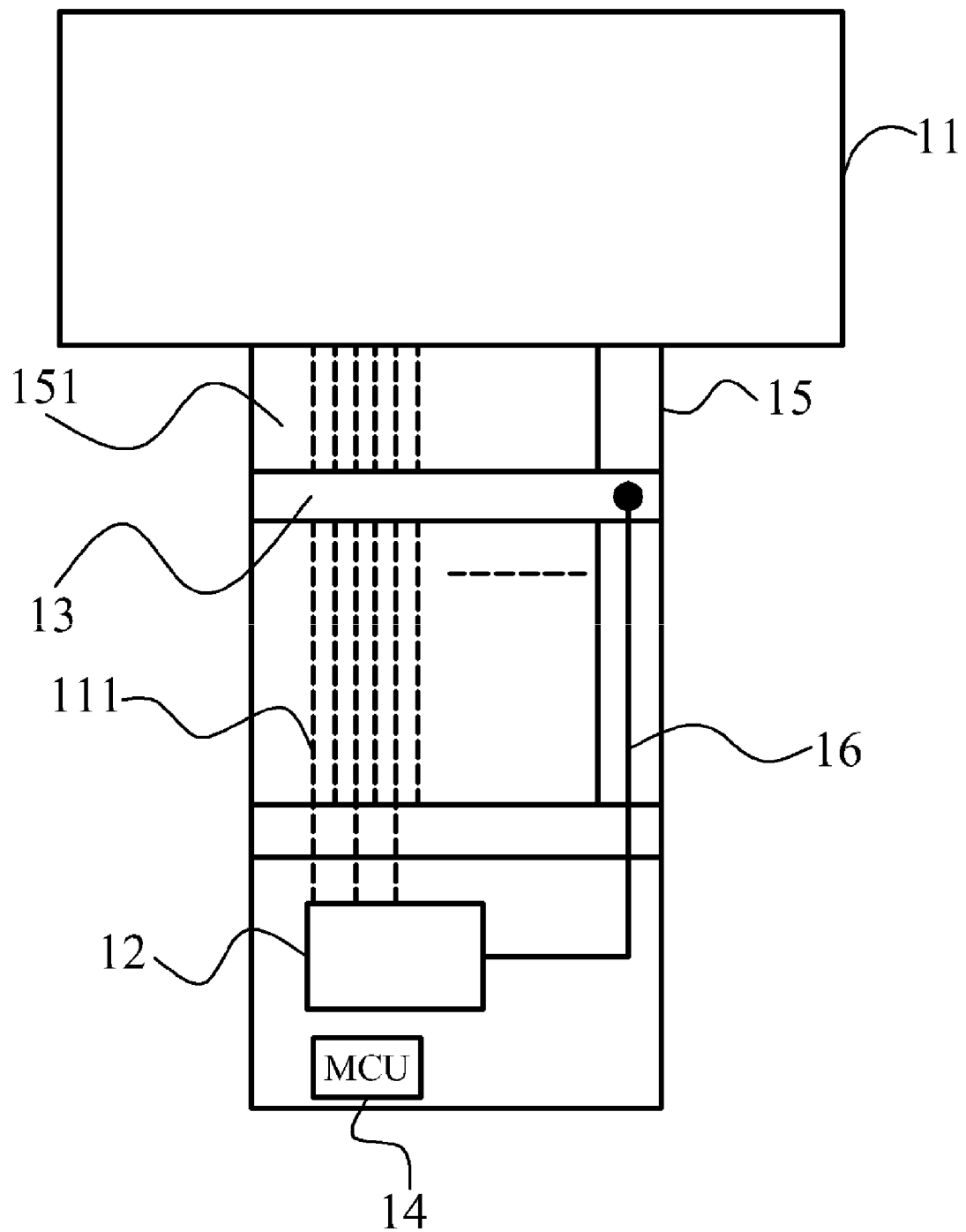
FIG. 5 is a schematic view for a one dimensional capacitive touch sensitive device according to a first embodiment of the present invention.
Figure 6:
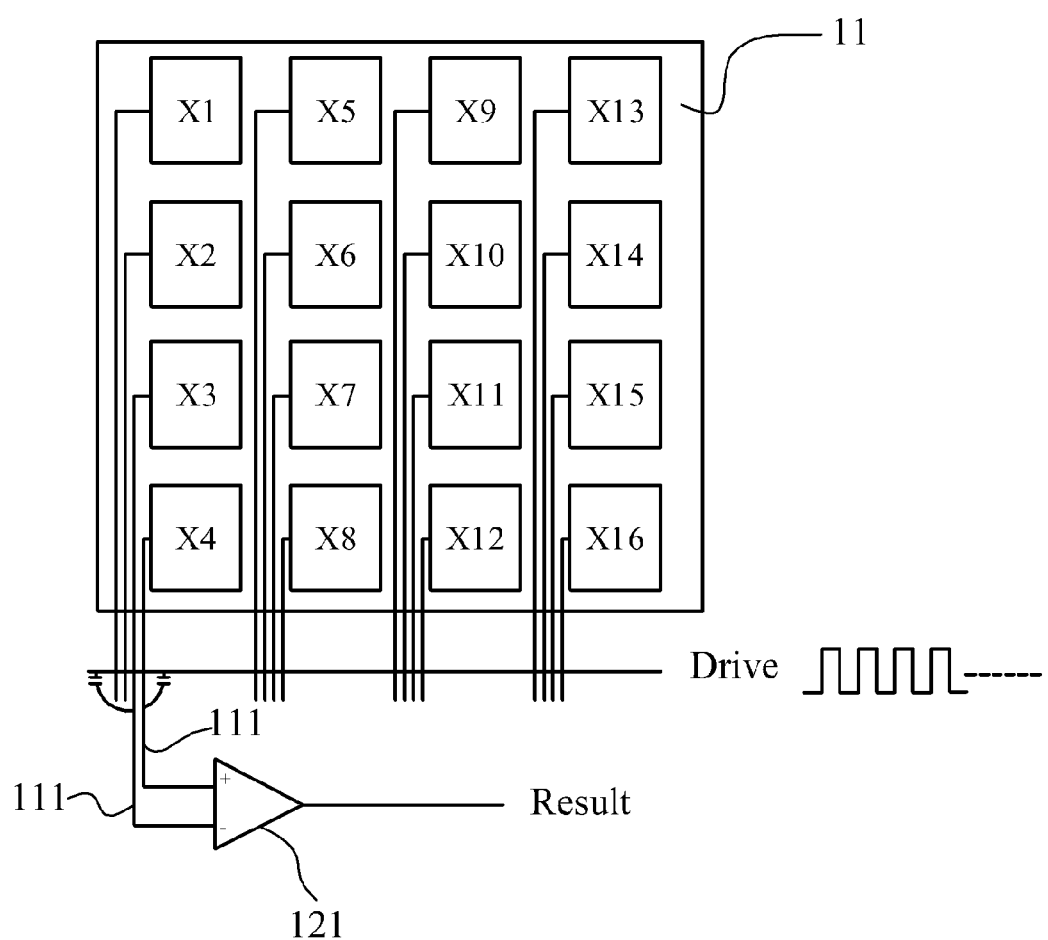
FIG. 6 shows a one dimensional capacitive touch panel in FIG. 5.

Referring to FIGS. 5 and 6, a schematic view for a one dimensional capacitive touch sensitive device according to a first embodiment of the present invention, and one dimensional capacitive touch panel in FIG. 5, respectively; this example shows that a one dimensional touch sensitive device includes a one dimensional touch panel 11, a driving and sensing circuit 12, an conductive member 13, and a microcontroller unit 14. The one dimensional touch panel 11 includes plural X electrodes X1 to X16 in array form on a substrate (not shown), and material for the substrate may be, not limited to, glass, polycarbonate (PC), PMMA, Polyethylene Terephthalate (PET), or Tri-cellulose Acetate (TCA).

Each of the electrodes forms a cell of a sensing structure in the panel, and though appears as a square shape in the figure, it is not a limitation, for example, other shape such as rhombus, rectangular, hexagonal, circular or the like may be alternative. Each electrode is connected to the driving and sensing circuit 12 through a sensing line 111. As in the figure, two of the electrodes X3 and X4 serve for two inputs of a comparator 121. Material for the electrode may be but not limited to Indium Tin Oxide (ITO), Antimony Tin Oxide (ATO), Indium-Zinc Oxide (IZO), Zinc oxide (ZnO) or the like.

The conductive member 13 in form of bar is laid on a covering layer 151 of an FPC 15, while at least a portion of each sensing lines 111 is enclosed within the covering layer of the FPC 15 so that the conductive member 13 does not contact with any sensing lines 111. The conductive member 13 is also electrically connected to the driving and sensing circuit 12 through a driving line 16 and crosses sensing lines 111 in orthogonal configuration.

The driving and sensing circuit 12 and the microcontroller unit 14 are electrically connected to each other, and the microcontroller unit 14 controls the driving and sensing circuit 12 to send signals through the driving line 16 to the conductive member 13. Thus, when a device user touches on the touch panel with his finger, touching event can be sensed and touching position can be determined by the same differential driving technique in prior art.

Structure of the present invention overcomes a drawback of unstable coupling capacitance in one dimensional touch panel which strongly influences sensing effect. Compared to prior art, a stable coupling capacitance is provided on an FPC in the present invention, and it can be adjusted easily. For example, by adjusting quantity, width, and even voltage of the conductive member, the coupling capacitance can be changed as desired so as to attain the control over stability of coupling capacitance, which is described in detail hereinafter.

Figure 7:
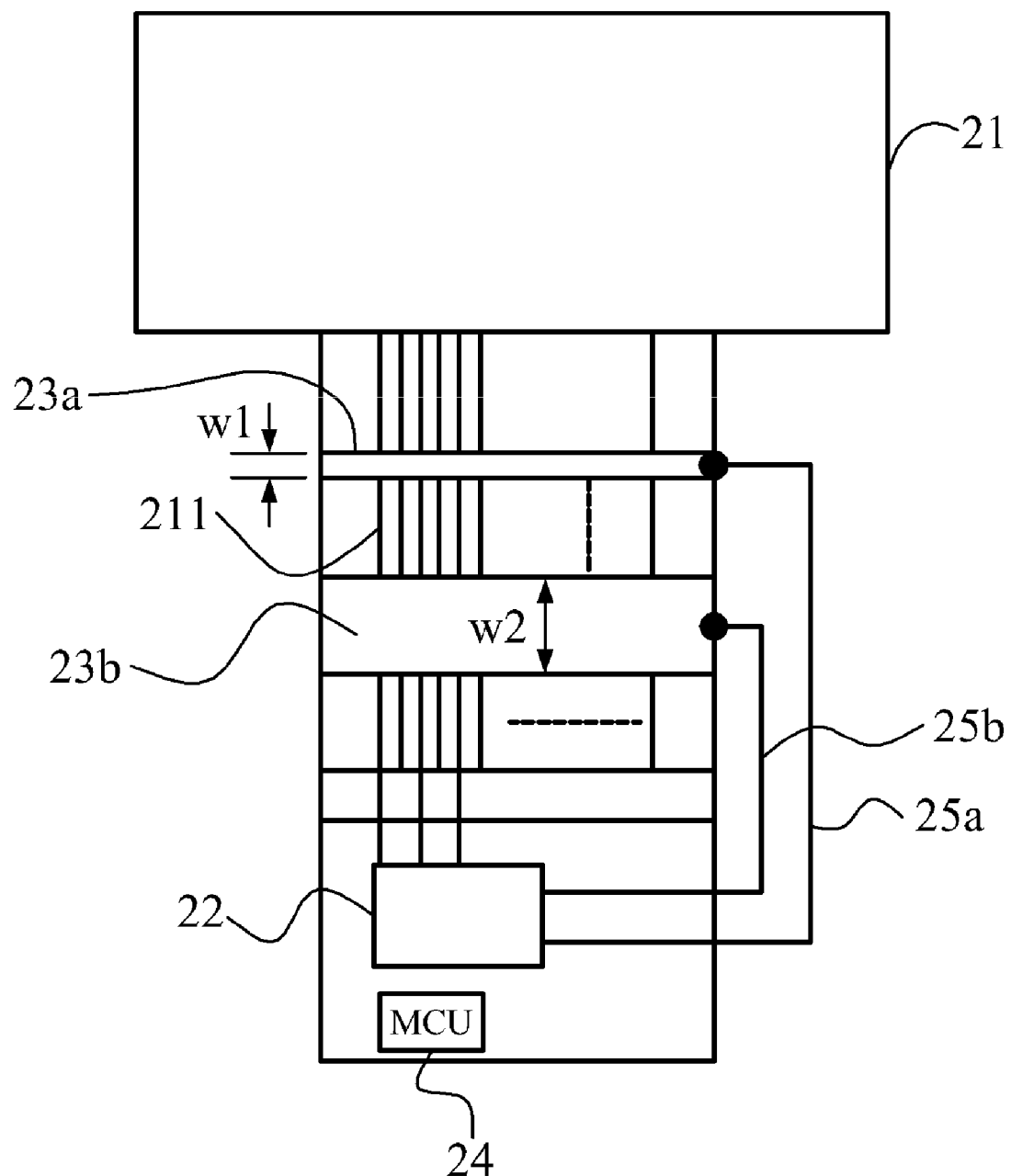
FIG. 7 a schematic view for a two dimensional capacitive touch sensitive device according to a second embodiment of the present invention.

Referring to FIG. 7, a schematic view for a capacitive touch sensitive device according to a second embodiment of the present invention; novel structure design of the present invention is capable of improving signal resolution by adjusting quantity, width, or voltage of the conductive member. Advantage above is not only applicable to one dimensional capacitive touch sensitive device, but also to two dimensional version. As shown in the figure, a capacitive touch sensitive device mainly includes a touch panel 21, a driving and sensing circuit 22, two conductive members 23*a* and 23*b*, and a microcontroller unit 24. Electrodes of the touch panel 21 are connected to the driving and sensing circuit 22 through respective sensing lines 211.

The conductive members 23*a* and 23*b* of the widths W1 and W2 (may be equal or distinguished) are arranged above the sensing lines 211 and spaced apart from each other. The conductive members 23*a* and 23*b* are also electrically connected to the driving and sensing circuit 22 through driving lines 25*a* and 25*b* and have a cross and orthogonal relation with respect to the sensing lines 211.

The driving and sensing circuit 22 and the microcontroller unit 24 are electrically connected with each other so that the microcontroller unit 24 controls the driving and sensing circuit 22 to drive simultaneously the two conductive members 23*a* and 23*b*.

Figure 8:
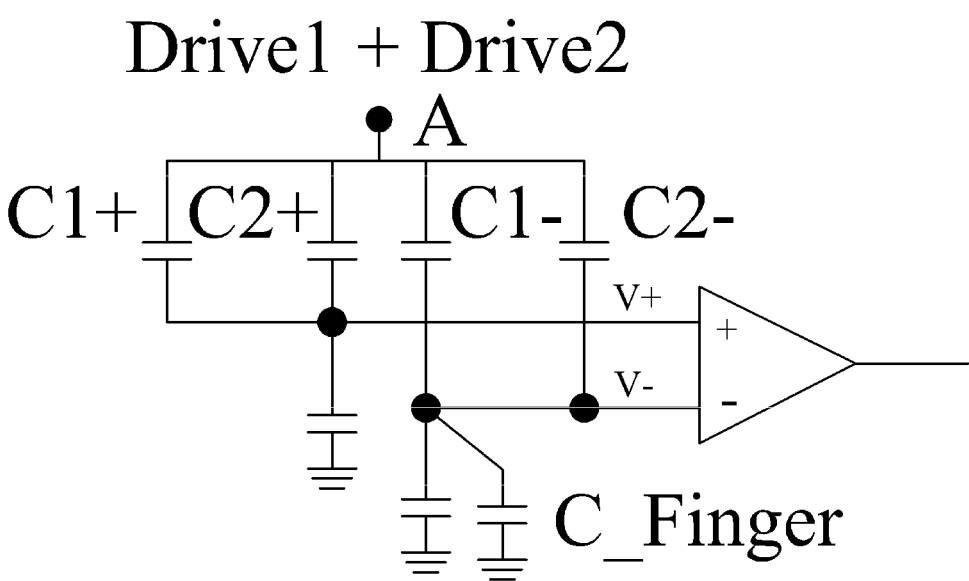
FIG. 8 shows an equivalent circuit diagram for the capacitive touch sensitive device with addition of two conductive members.

FIG. 8 shows an equivalent circuit diagram for the capacitive touch sensitive device with addition of two conductive members. It shows in the figure that both input terminals V+ and V− are provided with capacitors in parallel due to addition of the conductive members, and subsequently the equivalent capacitance is increased moderately, leading to a lowered voltage between node A and V+ (also between node A and V−). The larger voltage difference occurs to a coupling capacitance C_Finger which is induced by finger touch, and thus the voltage difference between two input terminals V+ and V− is amplified so that the probing by the driving and sensing circuit 22 becomes more sensitive. It should be noted that both inappropriately large or small equivalent capacitance will result in adverse effect and the best solution can be obtained by adjusting relative area of the conductive members 23*a* and 23*b*.

Figure 14:
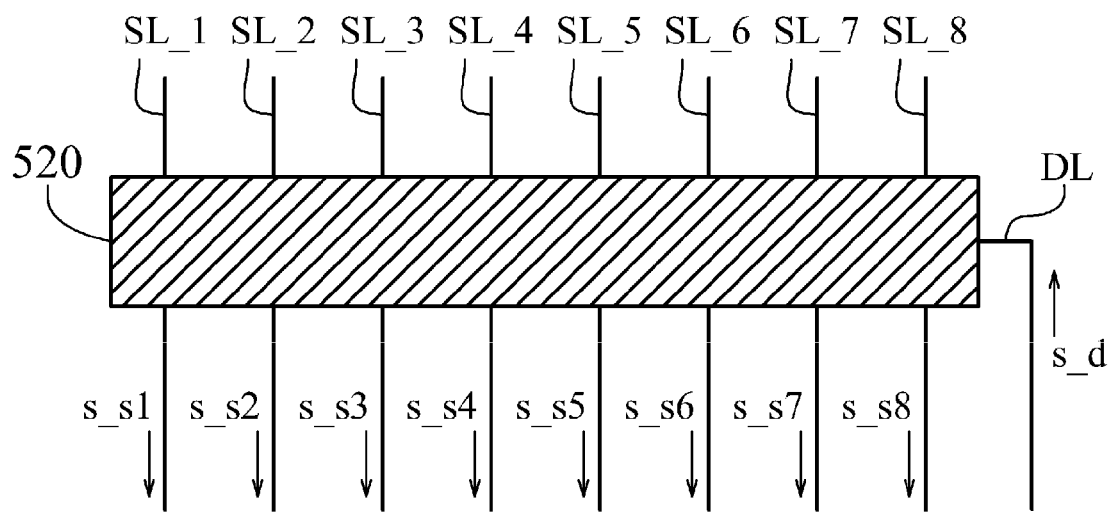
FIGS. 14-17 show four kinds of arrangement of conductive member(s) with respect to sensing lines and signal transmission related thereto.

FIG. 14 illustrates arrangement for a single conductive member and related signal transmission. A single conductive member 520 is arranged to cross plural sensing lines SL_1 to SL_8, and is electrically connected to a driving and sensing circuit (not shown) via a driving line DL. The figure shows that a driving signal is transmitted on the driving line DL, and in response plural sensing signals s_s1 to s_s8 are transmitted on the sensing lines SL_1 to SL_8.

Figure 15:
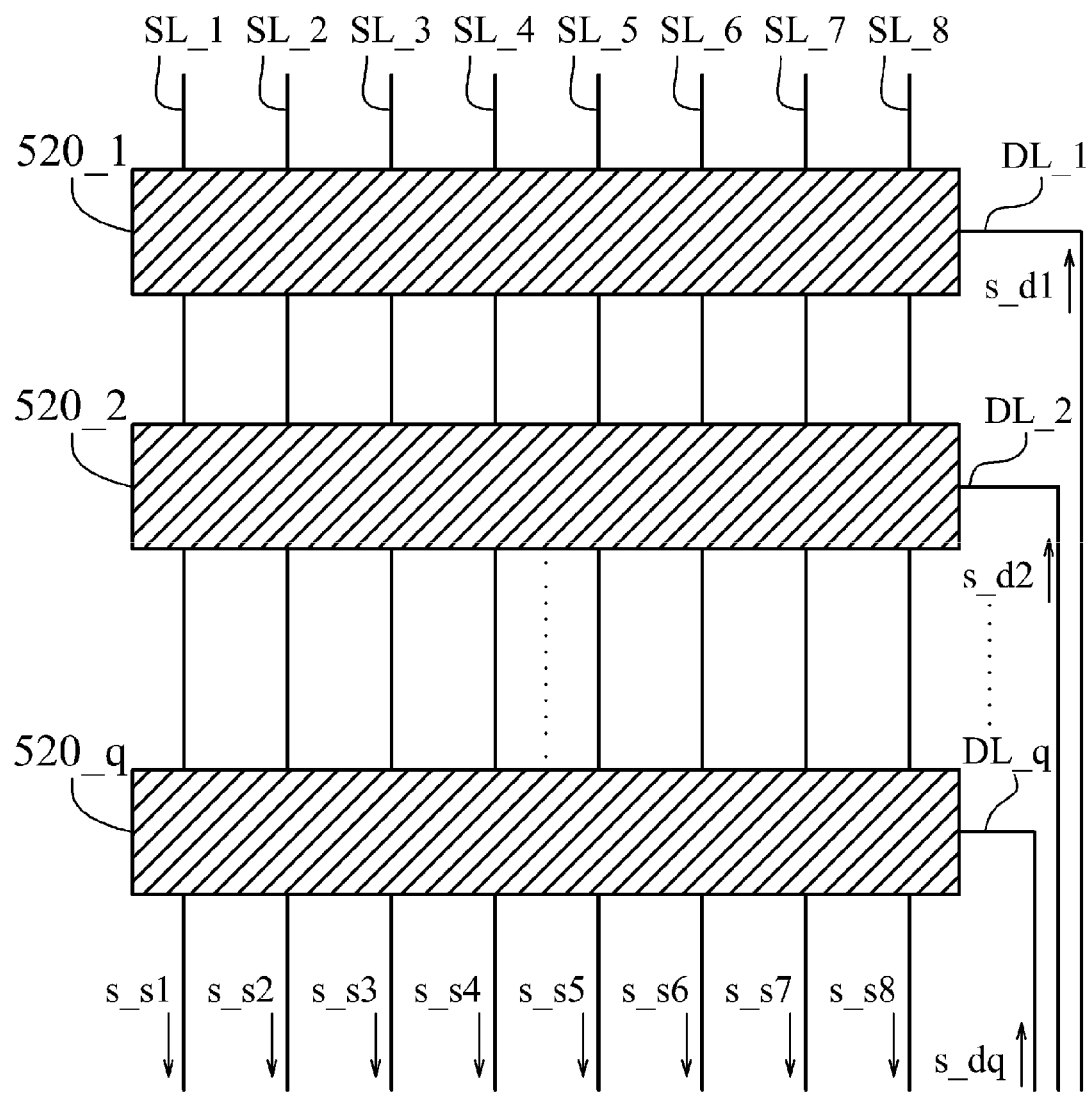
Figure 16:
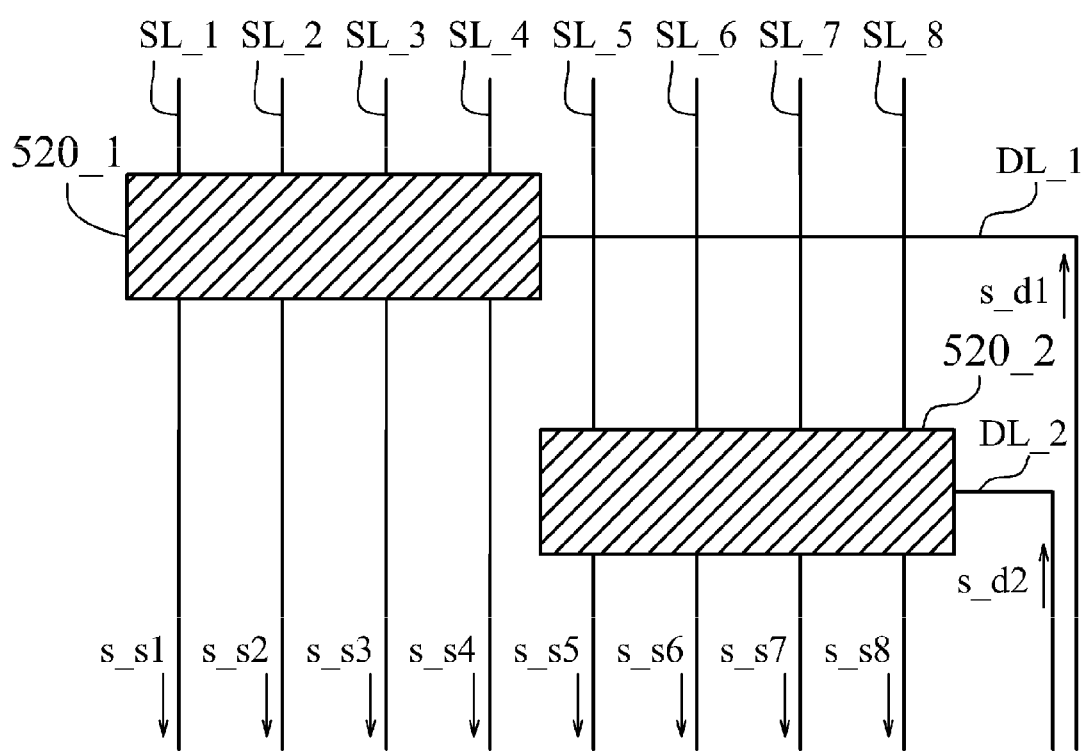
Figure 17:
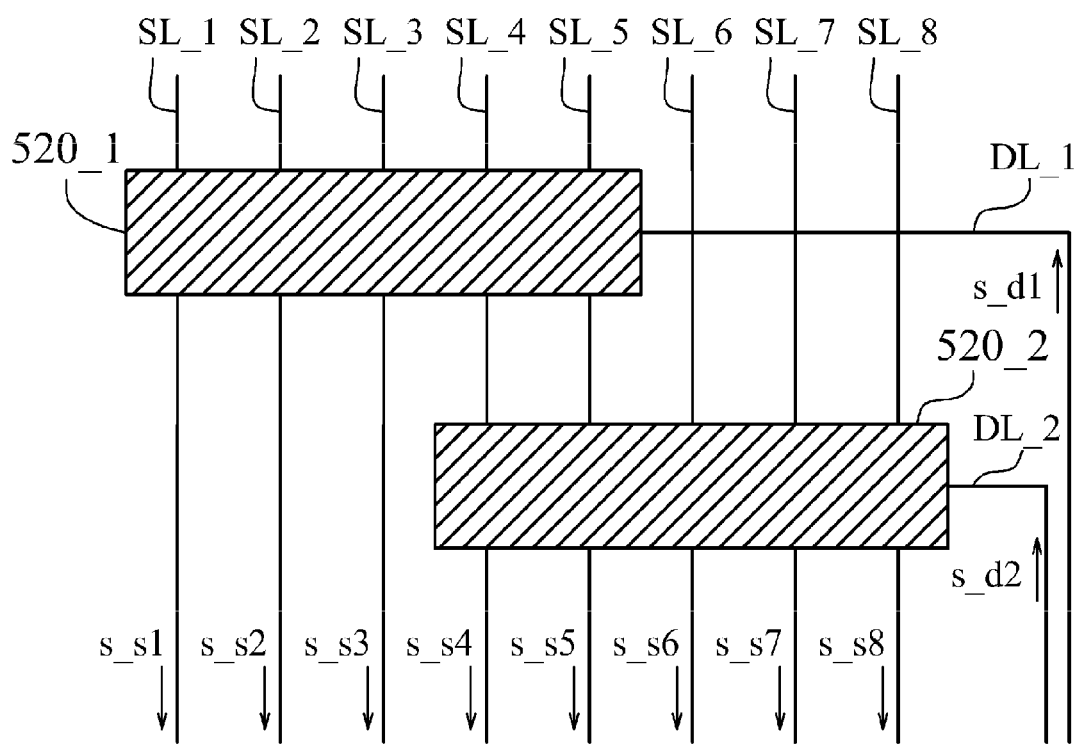

On the other hand, when plural conductive members are involved, FIGS. 15-17 show three kinds of possible arrangement. In FIG. 15, conductive members 520_1 to 520_*q* cross the identical group of sensing lines SL_1 to SL_8, and are electrically connected to respective driving lines DL_1 to DL_q to receive respective driving signals s_d1 to s_dq, where q is a positive integer, determined by designer. In this embodiment, the driving signals s_d1 to s_dq may be the same or different signals as desired, without limitation imposed. In the case of same signal, all conductive members 520_1 to 520_*q* may be configured to be electrically connected to the driving and sensing circuit via single driving line, though it is not limitation to the present invention.

In the case of multiple conductive members, each conductive member can be configured to cross respective groups of sensing lines. The respective groups of sensing lines may have no common sensing lines, or alternatively, have at least one common sensing line, and FIG. 16 shows an example of the former. Here the case of each conductive member crossing four sensing lines is taken for example, though the number of four should not be deemed a limitation to the present invention.

In FIG. 16, a conductive member 520_1 crosses a group of sensing lines SL_1 to SL_4 while another conductive member 520_2 crosses another group of sensing lines SL_5 to SL_8. The conductive members 520_1 and 520_2 are electrically connected with driving lines DL_1 and DL_2 respectively for receiving respective driving signals s_d1 and s_d2. It can be seen that all sensing lines SL_1 to SL_4 crossed by the conductive member 520_1 are different from those sensing lines S_5 to SL_8 crossed by the conductive member 520_2, that is to say, the respective groups of sensing lines have no common sensing lines. It is apparent that configuration is a typical application of two dimensional capacitive touch panel.

FIG. 17 shows an example of respective groups of sensing lines having common sensing lines. In FIG. 17, a conductive member 520_1 crosses a group of sensing lines SL_1 to SL_5 while another conductive member 520_2 crosses another group of sensing lines SL_4 to SL_8. Two conductive members 520_1 and 520_2 are electrically connected with driving lines DL_1 and DL_2 respectively for receiving respective driving signals s_d1 and s_d2. Among the sensing lines SL_1 to SL_5 crossed by the conductive member 520_1, the sensing lines SL_4 and SL_5 are also crossed by the conductive member 520_2, that is to say, the respective groups of sensing lines have common sensing lines. Again, the number of common lines in the example above should not be deemed a limitation to the present invention.

Similar to example of FIG. 15, driving signals s_d1 and s_d2 in examples for FIGS. 16 and 17 can be the same or different signals as desired, and when the driving signals s_d1 and s_d2 are of the same, two conductive members 520_1 and 520_2 may be electrically connected to a driving and sensing circuit through a single driving line, though it is not a limitation to the present invention. Further, signal resolution can also be changed by altering the width of the conductive member.

Figure 9:
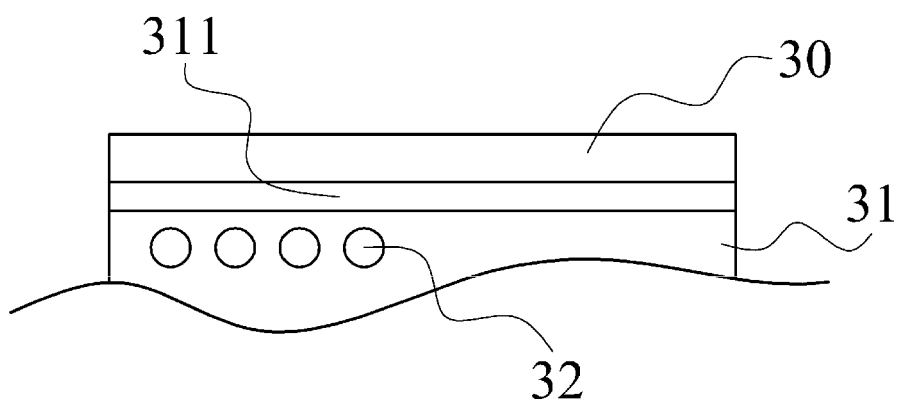
FIG. 9 shows arrangement for conductive member of a capacitive touch sensitive device according to a third embodiment of the present invention.
Figure 10:
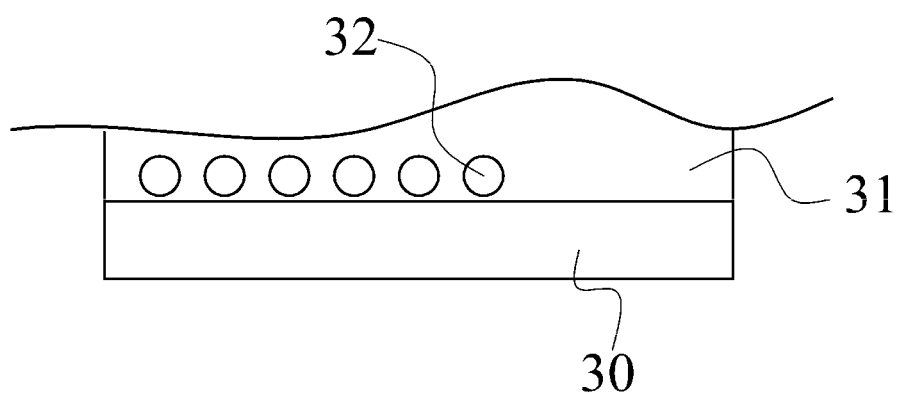
FIG. 10 shows arrangement for conductive member of a capacitive touch sensitive device according to a fourth embodiment of the present invention.

Referring to FIG. 9, arrangement for conductive member of a capacitive touch sensitive device according to a third embodiment of the present invention, and to FIG. 10, arrangement for conductive member of a capacitive touch sensitive device according to a fourth embodiment of the present invention; in FIG. 9, the conductive member 30 is arranged above sensing lines 32 and on a covering layer of a carrier such as an FFC 31 which encloses the sensing lines 32, and in FIG. 10, the conductive member 30 is arranged under the sensing lines 32 and directly under the FFC 31 in absence of a covering layer.

Figure 11:
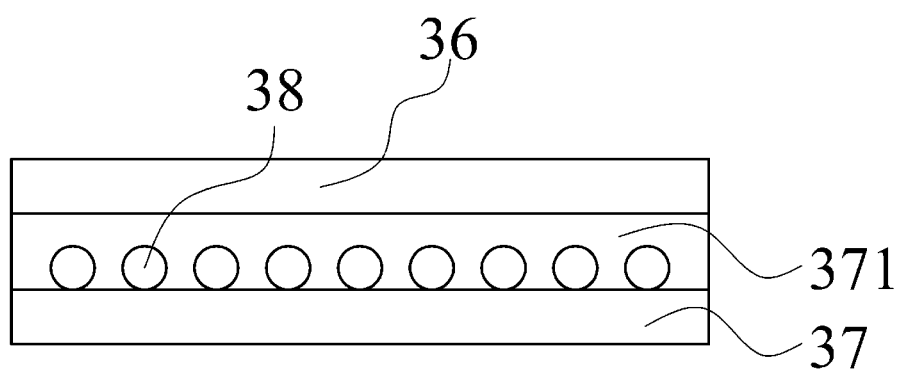
FIG. 11 shows arrangement for conductive member of a capacitive touch sensitive device according to a fifth embodiment of the present invention.

Referring to FIG. 11, arrangement for conductive member of a capacitive touch sensitive device according to a fifth embodiment of the present invention; a conductive member 36 is arranged on a covering layer 371 of a PCB 37 and above plural sensing lines 38.

Figure 12:
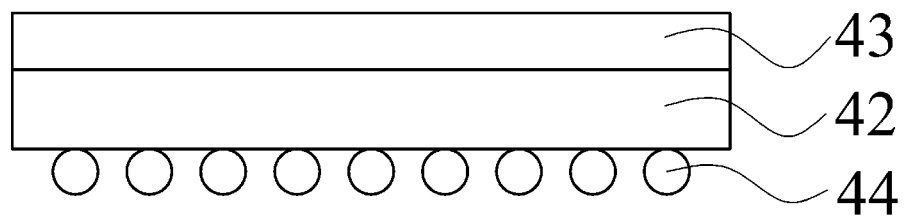
FIG. 12 shows arrangement for conductive member of a capacitive touch sensitive device according to a sixth embodiment of the present invention.

Referring to FIG. 12, arrangement for conductive member of a capacitive touch sensitive device according to a sixth embodiment of the present invention; this example illustrates a conductive member 43 is arranged on one side of a PCB 42 while sensing lines 44 on the opposite side.

Figure 13:
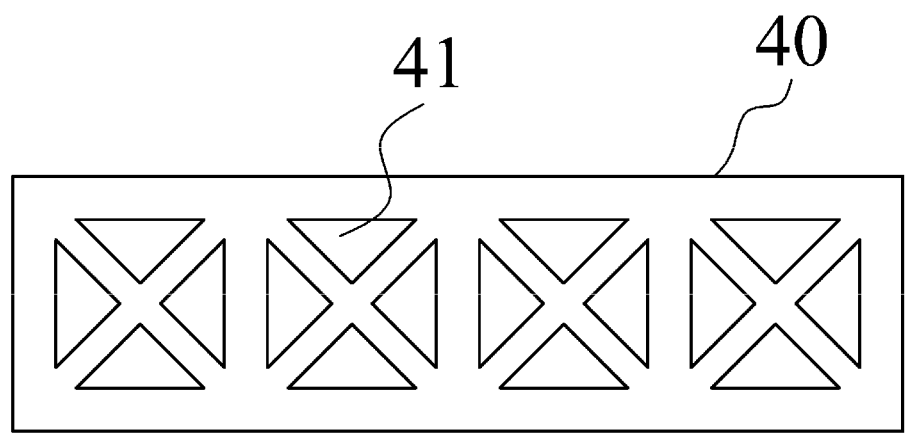
FIG. 13 shows arrangement for conductive member of a capacitive touch sensitive device according to a seventh embodiment of the present invention.

Referring to FIG. 13, arrangement for conductive member of a capacitive touch sensitive device according to a seventh embodiment of the present invention; this embodiment primarily provides an conductive member 40 with mesh configuration 41. Such mesh configuration 41 allows for adjustment of equivalent coupling capacitance and prevention from peeling accident.

Figure 18:
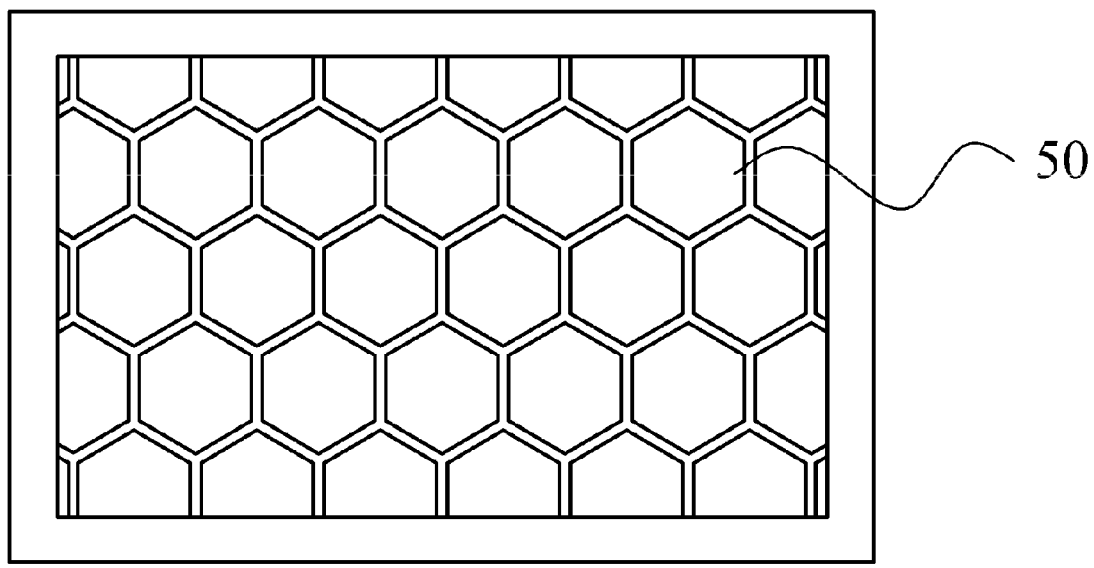
FIG. 18 shows panel electrodes of honeycomb pattern of a touch sensitive device according to the present invention.

FIG. 18 shows electrodes 50 of the capacitive touch panel are configured to be hexagonal and each of the electrodes is surrounded by six other electrodes, so as to form a honeycomb pattern altogether. Such kind of configuration provides a better recognition resolution for user operation.

In embodiments of the touch sensitive device according to the present invention, material for conductive member includes but not limited to silver paste, copper, or aluminum foil. The foregoing description, for purposes of explanation, was set forth in specific details of the preferred embodiments to provide a thorough understanding of the invention. However, it will be apparent to one skilled in the art that specific details are not required in order to practice the invention. Therefore, the foregoing descriptions of specific embodiments of the invention are presented for purposes of illustration and description only and should not be construed in any way to limit the scope of the invention. They are not intended to be exhaustive or to limit the invention to the precise forms disclosed; obviously, many modifications and variations are possible in view of the above teachings. The embodiments were chosen and described in order to best explain the principles of the invention and its practical applications, thereby enabling others skilled in the art to best utilize the invention and various embodiments with various modifications as are suited to the particular use contemplated. It is intended that the following Claims and their equivalents define the scope of the invention.

What is claimed is:

1. A touch sensitive device, comprising:
    a capacitive touch panel comprising plural electrodes;
    a driving and sensing circuit electrically connected to the electrodes of the capacitive touch panel through plural sensing lines; and
    at least one conductive member arranged to cross over the sensing lines without contact with any of the sensing lines, and electrically connected to the driving and sensing circuit,
    wherein the driving and sensing circuit outputs a driving signal to the capacitive touch panel through the at least one conductive member, and receiving sensing signals through the sensing lines, so as to generate a coupling effect between the at least one conductive member and the sensing lines for detecting a touch-sensing action at the capacitive touch panel.

2. The touch sensitive device of claim 1, wherein the at least one conductive member is arranged above the sensing lines and on a covering layer of a carrier which encloses the sensing lines.

3. The touch sensitive device of claim 1, wherein the at least one conductive member is arranged under the sensing lines and directly under an FFC in absence of a covering layer.

4. The touch sensitive device of claim 1, wherein the at least one conductive member is arranged on a covering layer of a PCB and above the sensing lines.

5. The touch sensitive device of claim 1, wherein the at least one conductive member is arranged on one side of a PCB while the sensing lines on an opposite side.

6. The touch sensitive device of claim 1, wherein the at least one conductive member is made of carbon, silver paste, copper or aluminum foil.

7. The touch sensitive device of claim 1, wherein the at least one conductive member includes a mesh configuration.

8. The touch sensitive device of claim 1, wherein the capacitive touch panel refers to a one dimensional capacitive touch panel.

9. The touch sensitive device of claim 1, wherein the at least one conductive member is orthogonal to the sensing lines.

10. The touch sensitive device of claim 1, wherein the plural electrodes are configured to be hexagonal and arranged to be a honeycomb pattern altogether.

11. The touch sensitive device of claim 1, wherein the at least one conductive member refers to a single conductive member arranged to cross over the sensing lines.

12. The touch sensitive device of claim 1, wherein the at least one conductive member includes a first conductive member arranged to cross over a first group of the sensing lines and a second conductive member arranged to cross over a second group of the sensing lines where the sensing lines in the first group are the same ones as in the second group.

13. The touch sensitive device of claim 1, wherein the at least one conductive member includes a first conductive member arranged to cross over a first group of the sensing lines and a second conductive member arranged to cross over a second group of the sensing lines where the first group and the second group have no common sensing lines.

14. The touch sensitive device of claim 1, wherein the at least one conductive member includes a first conductive member arranged to cross over a first group of the sensing lines and a second conductive member arranged to cross over a second group of the sensing lines where the first group and the second group have at least one common sensing line.

15. A touch sensitive device, comprising:
    a capacitive touch panel comprising plural electrodes formed in a specified area;
    a driving and sensing circuit electrically connected to the electrodes of the capacitive touch panel through plural sensing lines extending out of the specified area; and
    at least one conductive member arranged to cross over the sensing lines outside the specified area without contact with any of the sensing lines, and electrically connected to the driving and sensing circuit, wherein the driving and sensing circuit outputs a driving signal to the capacitive touch panel through the at least one conductive member, and receiving sensing signals through the sensing lines, so as to generate a coupling effect between the at least one conductive member and the sensing lines for detecting a touch-sensing action at the capacitive touch panel.

* * * * *